United States Patent
Check et al.

(10) Patent No.: US 12,007,326 B2
(45) Date of Patent: Jun. 11, 2024

(54) LOCALIZED SURFACE PLASMON RESONANCE FOR ENHANCED PHOTOLUMINESCENCE OF LUMIPHORIC MATERIALS

(71) Applicant: CreeLED, Inc., Durham, NC (US)

(72) Inventors: Michael Check, Holly Springs, NC (US); David Suich, Durham, NC (US); Steven Wuester, Wake Forest, NC (US)

(73) Assignee: CreeLED, Inc., Durham, NC (US)

( * ) Notice: Subject to any disclaimer, the term of this patent is extended or adjusted under 35 U.S.C. 154(b) by 375 days.

(21) Appl. No.: 17/471,951

(22) Filed: Sep. 10, 2021

(65) Prior Publication Data

US 2023/0083154 A1    Mar. 16, 2023

(51) Int. Cl.
| | | |
|---|---|---|
| *G01N 21/552* | (2014.01) | |
| *B82Y 30/00* | (2011.01) | |
| *H01L 33/50* | (2010.01) | |
| *H01L 33/56* | (2010.01) | |

(52) U.S. Cl.
CPC ......... *G01N 21/554* (2013.01); *H01L 33/502* (2013.01); *H01L 33/56* (2013.01); *B82Y 30/00* (2013.01)

(58) Field of Classification Search
CPC ..... G01N 21/554; H01L 33/502; H01L 33/56; H01L 2933/0083; H01L 33/44; B82Y 30/00; B82Y 20/00
See application file for complete search history.

(56) References Cited

U.S. PATENT DOCUMENTS

| | | | | |
|---|---|---|---|---|
| 2014/0243934 A1* | 8/2014 | Vo-Dinh | ................. | A61P 33/00 607/88 |
| 2015/0036234 A1* | 2/2015 | Ben-Yakar | ............. | H10N 99/05 438/69 |
| 2015/0155449 A1* | 6/2015 | Kim | ........................ | B82B 1/00 257/13 |

(Continued)

OTHER PUBLICATIONS

Cho, et al., "Surface plasmon-enhanced light-emitting diodes using silver nanoparticles embedded in p-GaN," Nanotechnology, vol. 21, 2010, IOP Publishing, 7 pages.

(Continued)

*Primary Examiner* — Tarifur R Chowdhury
*Assistant Examiner* — Akbar H. Rizvi
(74) *Attorney, Agent, or Firm* — Withrow & Terranova, P.L.L.C.

(57) ABSTRACT

Lumiphoric materials and corresponding light-emitting devices, and more particularly localized surface plasmon resonance for enhanced photoluminescence of lumiphoric materials are disclosed. Plasmonic materials are disclosed that are configured to induce localized surface plasmon resonance and excite a corresponding localized surface plasmon enhanced electric field in response to incident light. An increase in photoluminescence of lumiphoric materials may be realized when the lumiphoric materials are arranged within the localized surface plasmon enhanced electric field. Plasmonic materials are disclosed that include various arrangements of nanoparticles and/or patterned structures with corresponding dielectric materials that are collectively arranged in close proximity to lumiphoric materials.

24 Claims, 8 Drawing Sheets

(56) References Cited

U.S. PATENT DOCUMENTS

2019/0113727 A1* 4/2019 Tamma .................. H01L 33/58

OTHER PUBLICATIONS

Fan, et al., "Improving the performance of light-emitting diodes via plasmonic-based strategies," Journal of Applied Physics, vol. 127, Jan. 27, 2020, AIP Publishing, 16 pages.

Gu, et al., "Light-emitting diodes enhanced by localized surface plasmon resonance," Nanoscale Research Letters, vol. 6, Mar. 2011, 12 pages.

* cited by examiner

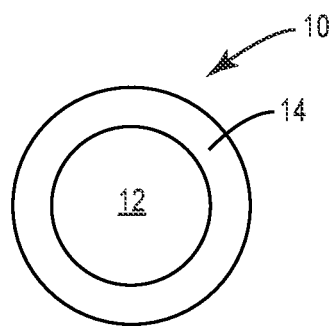
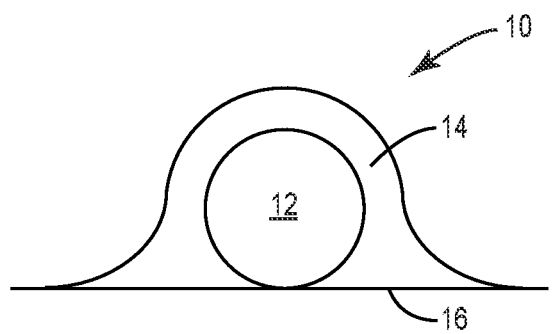
*FIG. 1A*          *FIG. 1B*
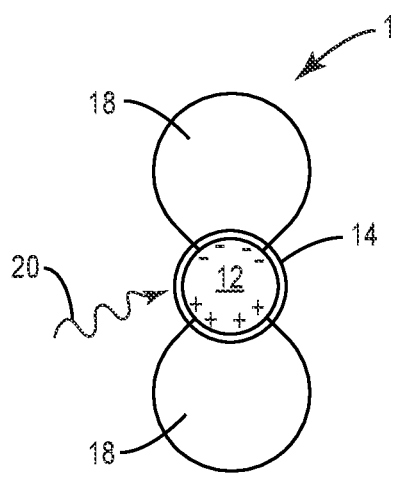
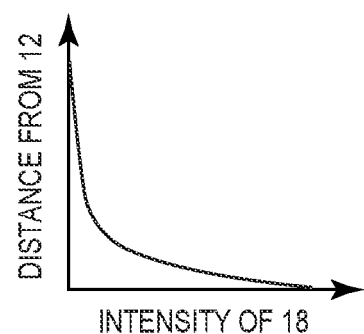
*FIG. 1C*          *FIG. 1D*

LOCALIZED SURFACE PLASMON RESONANCE FOR ENHANCED PHOTOLUMINESCENCE OF LUMIPHORIC MATERIALS

FIELD OF THE DISCLOSURE

The present disclosure relates to lumiphoric materials and corresponding light-emitting devices, and more particularly to localized surface plasmon resonance for enhanced photoluminescence of lumiphoric materials.

BACKGROUND

Solid-state lighting devices such as light-emitting diodes (LEDs) are increasingly used in both consumer and commercial applications. Advancements in LED technology have resulted in highly efficient and mechanically robust light sources with a long service life. Accordingly, modern LEDs have enabled a variety of new display applications and are being increasingly utilized for general illumination applications, often replacing incandescent and fluorescent light sources.

LEDs are solid-state devices that convert electrical energy to light and generally include one or more active layers of semiconductor material (or an active region) arranged between oppositely doped n-type and p-type layers. When a bias is applied across the doped layers, holes and electrons are injected into the one or more active layers where they recombine to generate emissions such as visible light or ultraviolet emissions. An LED chip typically includes an active region that may be fabricated, for example, from silicon carbide, gallium nitride, gallium phosphide, aluminum nitride, gallium arsenide-based materials, and/or from organic semiconductor materials. Photons generated by the active region are initiated in all directions.

Typically, it is desirable to operate LEDs at the highest light emission efficiency possible, which can be measured by the emission intensity in relation to the output power (e.g., in lumens per watt). A practical goal to enhance emission efficiency is to maximize extraction of light emitted by the active region in the direction of the desired transmission of light. Light extraction and external quantum efficiency of an LED can be limited by a number of factors, including internal reflection. According to the well-understood implications of Snell's law, photons reaching an interface between an LED surface and the surrounding environment or even an internal interface of the LED can be either refracted or internally reflected. If photons are internally reflected in a repeated manner, then such photons eventually are absorbed and never provide visible light that exits an LED.

LED packages have been developed that can provide mechanical support, electrical connections, and encapsulation for LED emitters. Lumiphoric materials, such as phosphors, may also be arranged in close proximity to LED emitters to convert portions of light emissions to different wavelengths. Light emissions that exit surfaces of LED emitters typically interact with various elements or surfaces of the LED package and lumiphoric materials before exiting, thereby increasing opportunities for light loss and potential non-uniformity of light emissions. As such, there can be challenges in producing high quality light with desired emission characteristics while also providing high light emission efficiency in LED packages.

The art continues to seek improved LEDs and solid-state lighting devices having desirable illumination characteristics capable of overcoming challenges associated with conventional lighting devices.

SUMMARY

Aspects disclosed herein relate to lumiphoric materials and corresponding light-emitting devices, and more particularly to localized surface plasmon resonance for enhanced photoluminescence of lumiphoric materials. Plasmonic materials are disclosed that are configured to induce localized surface plasmon resonance and excite a corresponding localized surface plasmon enhanced electric field in response to incident light. An increase in photoluminescence of lumiphoric materials may be realized when the lumiphoric materials are arranged within the plasmon electric field. Plasmonic materials are disclosed that include various arrangements of nanoparticles and/or patterned structures with corresponding dielectric materials that are collectively arranged in close proximity to lumiphoric materials.

In one aspect, a light-emitting device comprises: a light-emitting diode (LED) chip; a plasmonic material on the LED chip, wherein the plasmonic material is arranged to receive light emitted by the LED chip and induce a localized surface plasmon enhanced electric field; and a lumiphoric material arranged to receive light emitted by the LED chip, wherein the lumiphoric material is arranged at least partially within the localized surface plasmon enhanced electric field. In certain embodiments, at least a portion of the lumiphoric material is arranged within 30 nanometers (nm) of the plasmonic material, or within 10 nm of the plasmonic material.

In certain embodiments, the plasmonic material comprises at least one interface between a metal and a dielectric material. In certain embodiments, the metal comprises a patterned structure. The plasmonic material may comprise a plurality of metal nanoparticles. In certain embodiments, an individual metal nanoparticle of the plurality of metal nanoparticles comprises a shell coating of the dielectric material that at least partially encapsulates the individual metal nanoparticle. In certain embodiments, the dielectric material forms a continuous coating that at least partially encapsulates the plurality of metal nanoparticles. In certain embodiments, a thickness of the dielectric material is less than an average particle size of the plurality of metal nanoparticles. In certain embodiments, the plasmonic material is chemically bonded to the lumiphoric material.

In certain embodiments, the plasmonic material comprises a plurality of nanoparticles that are coated with a dielectric material; the lumiphoric material comprises a plurality of lumiphoric particles; and each lumiphoric particle of the plurality of lumiphoric particles is chemically bonded to at least one nanoparticle of the plurality of nanoparticles. In certain embodiments, the plasmonic material comprises a plurality of nanoparticles that are coated with a dielectric material; and the lumiphoric material comprises a plurality of lumiphoric particles in a binder, and the plasmonic material is intermixed with the plurality of lumiphoric particles within the binder. In certain embodiments, the plasmonic material comprises a plurality of nanoparticles that are coated with a dielectric material; and the lumiphoric material comprises a ceramic phosphor plate, and the plasmonic material is arranged within the ceramic phosphor plate. In certain embodiments, the lumiphoric material comprises a single crystal phosphor; and the plasmonic material is separated from the single crystal phosphor by a layer of dielectric material.

The plasmonic material may be arranged with decreased concentrations in areas that are registered with central portions of the LED chip as compared with other areas that are registered at or near peripheral portions of the LED chip. The plasmonic material may also be arranged in areas that are registered at or near peripheral portions of the LED chip, and other areas that are registered with central portions of the LED chip are devoid of the plasmonic material.

In another aspect, a light-emitting device comprises: an LED chip; and a wavelength conversion element that is arranged on the LED chip, wherein the wavelength conversion element comprises: a support element; a plasmonic material on the support element, wherein the plasmonic material is arranged to receive light emitted by the LED chip and induce a localized surface plasmon enhanced electric field; and a lumiphoric material arranged to receive light emitted by the LED chip, wherein the lumiphoric material is arranged at least partially within the localized surface plasmon enhanced electric field. In certain embodiments, at least a portion of the lumiphoric material is arranged within 30 nm of the plasmonic material. In certain embodiments, the plasmonic material comprises a plurality of metal nanoparticles on the support element and the plurality of metal nanoparticles are coated with a dielectric material. In certain embodiments, the plasmonic material comprises a patterned metal on the support element that is coated with a dielectric material. In certain embodiments, the lumiphoric material comprises a plurality of lumiphoric particles in a binder, and the plasmonic material is intermixed with the plurality of lumiphoric particles within the binder. In certain embodiments, the plasmonic material comprises a plurality of nanoparticles that are coated with a dielectric material. In certain embodiments, each lumiphoric particle of the plurality of lumiphoric particles is chemically bonded to at least one nanoparticle of the plurality of nanoparticles.

In another aspect, a lumiphoric material comprises: a lumiphoric particle; and a plasmonic material that is bonded to the lumiphoric particle, wherein the plasmonic material is configured to induce a localized surface plasmon enhanced electric field in response to incident light. In certain embodiments, the plasmonic material is chemically bonded to the lumiphoric particle. In certain embodiments, the plasmonic material comprises at least one nanoparticle that is coated with a dielectric material. In certain embodiments, the at least one nanoparticle comprises a metal nanoparticle. The lumiphoric material may further comprise a binder, wherein the lumiphoric particle and the plasmonic material that is bonded to the lumiphoric particle are suspended in the binder. In certain embodiments, the lumiphoric particle and the plasmonic material that is bonded to the lumiphoric particle are arranged within a ceramic phosphor plate. In certain embodiments, the lumiphoric particle comprises a phosphor particle.

In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIG. 1A illustrates an exemplary plasmonic material that includes a nanoparticle with a corresponding dielectric material in the form of a coating or shell on the nanoparticle according to principles of the present disclosure.

FIG. 1B illustrates an exemplary plasmonic material that includes a nanoparticle on a surface with a corresponding dielectric material coating on the nanoparticle according to principles of the present disclosure.

FIG. 1C illustrates the plasmonic material of FIG. 1A with an associated localized surface plasmon enhanced electric field that is excited by incident light.

FIG. 1D is a plot illustrating intensity of the localized surface plasmon enhanced electric field relative to a distance away from the nanoparticle of FIG. 1C.

DETAILED DESCRIPTION

Figure 2A:
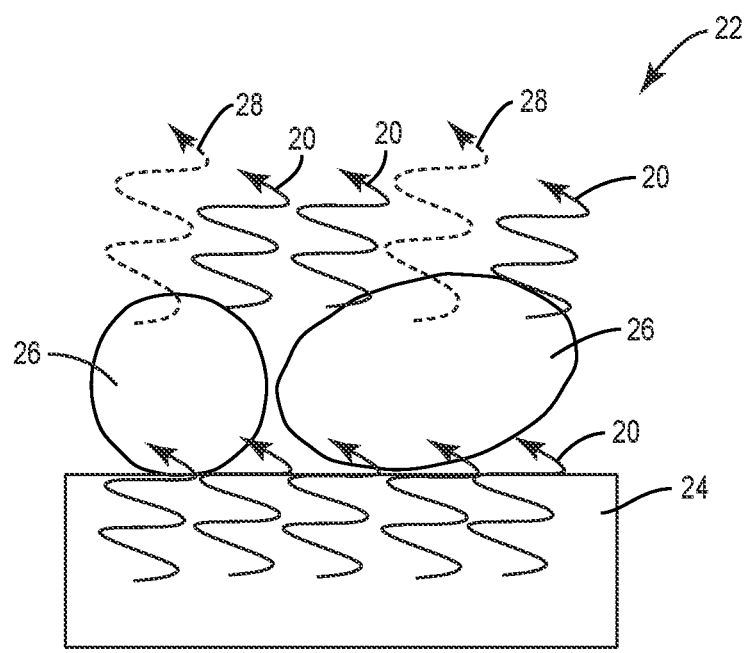
FIG. 2A is a cross-sectional view of a light-emitting device that includes a light-emitting diode (LED) chip and a lumiphoric material that is arranged to receive incident light that is generated by the LED chip.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

Aspects disclosed herein relate to lumiphoric materials and corresponding light-emitting devices, and more particularly to localized surface plasmon resonance for enhanced photoluminescence of lumiphoric materials. Plasmonic materials are disclosed that are configured to induce localized surface plasmon resonance and excite a corresponding localized surface plasmon enhanced electric field in response to incident light. An increase in photoluminescence of lumiphoric materials may be realized when the lumiphoric materials are arranged within the plasmon electric field. Plasmonic materials are disclosed that include various arrangements of nanoparticles and/or patterned structures with corresponding dielectric materials that are collectively arranged in close proximity to lumiphoric materials.

Before delving into specific details of various aspects of the present disclosure, an overview of various elements that may be included in exemplary light-emitting diode (LED) packages of the present disclosure is provided for context. An LED chip typically comprises an active LED structure or region that can have many different semiconductor layers arranged in different ways. The fabrication and operation of LEDs and their active structures are generally known in the art and are only briefly discussed herein. The layers of the active LED structure can be fabricated using known processes with a suitable process being fabrication using metal organic chemical vapor deposition. The layers of the active LED structure can comprise many different layers and generally comprise an active layer sandwiched between n-type and p-type oppositely doped epitaxial layers, all of which are formed successively on a growth substrate. It is understood that additional layers and elements can also be included in the active LED structure, including, but not limited to, buffer layers, nucleation layers, super lattice structures, undoped layers, cladding layers, contact layers, and current-spreading layers and light extraction layers and elements. The active layer can comprise a single quantum well, a multiple quantum well, a double heterostructure, or super lattice structures.

The active LED structure can be fabricated from different material systems, with some material systems being Group III nitride-based material systems. Group III nitrides refer to those semiconductor compounds formed between nitrogen (N) and the elements in Group III of the periodic table, usually aluminum (Al), gallium (Ga), and indium (In). Gallium nitride (GaN) is a common binary compound. Group III nitrides also refer to ternary and quaternary compounds such as aluminum gallium nitride (AlGaN), indium gallium nitride (InGaN), and aluminum indium gallium nitride (AlInGaN). For Group III nitrides, silicon (Si) is a common n-type dopant and magnesium (Mg) is a common p-type dopant. Accordingly, the active layer, n-type layer, and p-type layer may include one or more layers of GaN, AlGaN, InGaN, and AlInGaN that are either undoped or doped with Si or Mg for a material system based on Group III nitrides. Other material systems include silicon carbide (SiC), organic semiconductor materials, and other Group III-V systems such as gallium phosphide (GaP), gallium arsenide (GaAs), and related compounds.

The active LED structure may be grown on a growth substrate that can include many materials, such as sapphire, SiC, aluminum nitride (AlN), and GaN, with a suitable substrate being a 4H polytype of SiC, although other SiC polytypes can also be used including 3C, 6H, and 15R polytypes. SiC has certain advantages, such as a closer crystal lattice match to Group III nitrides than other substrates and results in Group III nitride films of high quality. SiC also has a very high thermal conductivity so that the total output power of Group III nitride devices on SiC is not limited by the thermal dissipation of the substrate. Sapphire is another common substrate for Group III nitrides and also has certain advantages, including being lower cost, having established manufacturing processes, and having good light-transmissive optical properties.

Different embodiments of the active LED structure can emit different wavelengths of light depending on the composition of the active layer and n-type and p-type layers. In some embodiments, the active LED structure emits blue light with a peak wavelength range of approximately 430 nanometers (nm) to 480 nm. In other embodiments, the active LED structure emits green light with a peak wavelength range of 500 nm to 570 nm. In other embodiments, the active LED structure emits red light with a peak wavelength range of 600 nm to 650 nm. In certain embodiments, the active LED structure may be configured to emit light that is outside the visible spectrum, including one or more portions of the ultraviolet (UV) spectrum. The UV spectrum is typically divided into three wavelength range categories denoted with letters A, B, and C. In this manner, UV-A light is typically defined as a peak wavelength range from 315 nm to 400 nm, UV-B is typically defined as a peak wavelength range from 280 nm to 315 nm, and UV-C is typically defined as a peak wavelength range from 100 nm to 280 nm. UV LEDs are of particular interest for use in applications related to the disinfection of microorganisms in air, water, and surfaces, among others. In other applications, UV LEDs may also be provided with one or more lumiphoric materials to provide LED packages with aggregated emissions having a broad spectrum and improved color quality for visible light applications.

An LED chip can also be covered with one or more lumiphoric materials (also referred to herein as lumiphores), such as phosphors, such that at least some of the light from the LED chip is absorbed by the one or more lumiphores and is converted to one or more different wavelength spectra according to the characteristic emission from the one or more lumiphores. In this regard, at least one lumiphore receiving at least a portion of the light generated by the LED source may re-emit light having different peak wavelength than the LED source. An LED source and one or more lumiphoric materials may be selected such that their combined output results in light with one or more desired characteristics such as color, color point, intensity, etc. In certain embodiments, aggregate emissions of LED chips, optionally in combination with one or more lumiphoric materials, may be arranged to provide cool white, neutral white, or warm white light, such as within a color temperature range of 2500 Kelvin (K) to 10,000 K. In certain embodiments, lumiphoric materials having cyan, green, amber, yellow, orange, and/or red peak wavelengths may be used. In some embodiments, the combination of the LED chip and the one or more lumiphores (e.g., phosphors) emits a generally white combination of light. The one or more phosphors may include yellow (e.g., YAG:Ce), green (e.g., LuAg:Ce), and red (e.g., $Ca_{i-x-y}Sr_xEu_yAlSiN_3$) emitting phosphors, and combinations thereof.

Lumiphoric materials as described herein may be or include one or more of a phosphor, a scintillator, a lumiphoric ink, a quantum dot material, a day glow tape, and the like. Lumiphoric materials may be provided by any suitable means, for example, direct coating on one or more surfaces of an LED, dispersal in an encapsulant material configured to cover one or more LEDs, and/or coating on one or more optical or support elements (e.g., by powder coating, inkjet printing, or the like). In certain embodiments, lumiphoric materials may be downconverting or upconverting, and combinations of both downconverting and upconverting materials may be provided. In certain embodiments, multiple different (e.g., compositionally different) lumiphoric materials arranged to produce different peak wavelengths may be arranged to receive emissions from one or more LED chips. One or more lumiphoric materials may be provided on one or more portions of an LED chip in various configurations. In certain embodiments, lumiphoric materials may be provided over one or more surfaces of LED chips, while other surfaces of such LED chips may be devoid of lumiphoric material. In certain embodiments, a top surface of an LED chip may include lumiphoric material, while one or more side surfaces of an LED chip may be devoid of lumiphoric material. In certain embodiments, all or substantially all outer surfaces of an LED chip (e.g., other than contact-defining or mounting surfaces) may be coated or otherwise covered with one or more lumiphoric materials. In certain embodiments, one or more lumiphoric materials may be arranged on or over one or more surfaces of an LED chip in a substantially uniform manner. In other embodiments, one or more lumiphoric materials may be arranged on or over one or more surfaces of an LED chip in a manner that is non-uniform with respect to one or more of material composition, concentration, and thickness. In certain embodiments, the loading percentage of one or more lumiphoric materials may be varied on or among one or more outer surfaces of an LED chip. In certain embodiments, one or more lumiphoric materials may be patterned on portions of one or more surfaces of an LED chip to include one or more stripes, dots, curves, or polygonal shapes. In certain embodiments, multiple lumiphoric materials may be arranged in different discrete regions or discrete layers on or over an LED chip.

In certain embodiments, one or more lumiphoric materials may be provided as at least a portion of a wavelength conversion element or cover structure that is provided over an LED chip. Wavelength conversion elements or cover structures may include a support element and one or more lumiphoric materials that are provided by any suitable means, such as by coating a surface of the support element or by incorporating the lumiphoric materials within the support element. In some embodiments, the support element may be composed of a transparent material, a semi-transparent material, or a light-transmissive material, such as sapphire, SiC, silicone, and/or glass (e.g., borosilicate and/or fused quartz). Wavelength conversion elements and cover structures of the present disclosure may be formed from a bulk material which is optionally patterned and then singulated. In certain embodiments, the patterning may be performed by an etching process (e.g., wet or dry etching), or by another process that otherwise alters a surface, such as with a laser or saw. In certain embodiments, wavelength conversion elements and cover structures may be thinned before or after the patterning process is performed. In certain embodiments, wavelength conversion elements and cover structures may comprise a generally planar upper surface that corresponds to a light emission area of the LED package.

Wavelength conversion elements and cover structures may be attached to one or more LED chips using, for example, a layer of transparent adhesive. In certain embodiments, the layer of the transparent adhesive may include silicone with a refractive index in a range of about 1.3 to about 1.6 that is less than a refractive index of the LED chip on which the wavelength conversion element is placed. In various embodiments, wavelength conversion elements may comprise configurations such as phosphor-in-glass or ceramic phosphor plate arrangements. Phosphor-in-glass or ceramic phosphor plate arrangements may be formed by mixing phosphor particles with glass frit or ceramic materials, pressing the mixture into planar shapes, and firing or sintering the mixture to form a hardened structure that can be cut or separated into individual wavelength conversion elements.

As used herein, a layer or region of a light-emitting device may be considered to be "transparent" when at least 80% of emitted radiation that impinges on the layer or region emerges through the layer or region. Moreover, as used herein, a layer or region of an LED is considered to be "reflective" or embody a "mirror" or a "reflector" when at least 80% of the emitted radiation that impinges on the layer or region is reflected. In some embodiments, the emitted radiation comprises visible light such as blue and/or green LEDs with or without lumiphoric materials. In other embodiments, the emitted radiation may comprise nonvisible light. For example, in the context of GaN-based blue and/or green LEDs, silver (Ag) may be considered a reflective material (e.g., at least 80% reflective). In the case of ultraviolet (UV) LEDs, appropriate materials may be selected to provide a desired, and in some embodiments high, reflectivity and/or a desired, and in some embodiments low, absorption. In certain embodiments, a "light-transmissive" material may be configured to transmit at least 50% of emitted radiation of a desired wavelength.

The present disclosure can be useful for LED chips having a variety of geometries, such as vertical geometry or lateral geometry. A vertical geometry LED chip typically includes anode and cathode connections on opposing sides or faces of the LED chip. A lateral geometry LED chip typically includes both anode and cathode connections on the same side of the LED chip that is opposite a substrate, such as a growth substrate. In certain embodiments, a lateral geometry LED chip may be mounted on a submount of an LED package such that the anode and cathode connections are on a face of the LED chip that is opposite the submount. In this configuration, wirebonds may be used to provide electrical connections with the anode and cathode connections. In other embodiments, a lateral geometry LED chip may be flip-chip mounted on a surface of a submount of an LED package such that the anode and cathode connections are on a face of the active LED structure that is adjacent to the submount. In this configuration, electrical traces or patterns may be provided on the submount for providing electrical connections to the anode and cathode connections of the LED chip. In a flip-chip configuration, the active LED structure is configured between the substrate of the LED chip and the submount for the LED package. Accordingly, light emitted from the active LED structure may pass through the substrate in a desired emission direction. In other embodiments, an active LED structure may be bonded to a carrier submount, and the growth substrate may be removed such that light may exit the active LED structure without passing through the growth substrate.

According to aspects of the present disclosure, LED packages may include one or more elements, such as lumiphoric materials, encapsulants, light-altering materials, lenses, and electrical contacts, among others, that are provided with one or more LED chips. In certain aspects, an LED package may include a support member, such as a submount or a leadframe. Suitable materials for the submount include, but are not limited to, ceramic materials such as aluminum oxide or alumina, AlN, or organic insulators like polyimide (PI) and polyphthalamide (PPA). In other embodiments, a submount may comprise a printed circuit board (PCB), sapphire, Si or any other suitable material. For PCB embodiments, different PCB types can be used such as standard FR-4 PCB, metal core PCB, or any other type of PCB. In still further embodiments, the support structure may embody a lead frame structure. Light-altering materials may be arranged within LED packages to reflect or otherwise redirect light from the one or more LED chips in a desired emission direction or pattern.

As used herein, light-altering materials may include many different materials including light-reflective materials that reflect or redirect light, light-absorbing materials that absorb light, and materials that act as a thixotropic agent. As used herein, the term "light-reflective" refers to materials or particles that reflect, refract, scatter, or otherwise redirect light. For light-reflective materials, the light-altering material may include at least one of fused silica, fumed silica, titanium dioxide ($TiO_2$), or metal particles suspended in a binder, such as silicone or epoxy. In certain aspects, the particles may have an index of refraction that is configured to refract light emissions in a desired direction. In certain aspects, light-reflective particles may also be referred to as light-scattering particles. A weight ratio of the light-reflective particles or scattering particles to a binder may comprise a range of about 1:1 to about 2:1. For light-absorbing materials, the light-altering material may include at least one of carbon, silicon, or metal particles suspended in a binder, such as silicone or epoxy. The light-reflective materials and the light-absorbing materials may comprise nanoparticles. In certain embodiments, the light-altering material may comprise a generally white color to reflect and redirect light. In other embodiments, the light-altering material may comprise a generally opaque or black color for absorbing light and increasing contrast. In certain embodiments, the light-altering material includes both light-reflective material and light-absorbing material suspended in a binder.

Aspects of the present disclosure relate to plasmonic material arrangements in light-emitting devices, such as LED chips and/or LED packages. As used herein, a plasmonic material refers to a material that induces a localized surface plasmon enhanced electric field in response to incident light that has a frequency that is similar to or matches the material's plasmon resonance frequency. The localized surface plasmon enhanced electric field is formed when light excites a coherent oscillation of free conduction electrons at the plasmonic material, and the enhanced electric field decays exponentially from the plasmonic material surface. In certain aspects, a plasmonic material may include various arrangements of nanoparticles and/or patterned structures and corresponding dielectric materials that are collectively arranged in close proximity to a lumiphoric material. In this manner, the plasmonic material may be arranged to induce localized surface plasmon resonance at various interfaces between the dielectric material and individual nanoparticles and/or the patterned structure to form the localized surface plasmon enhanced electric field. When a lumiphoric material is placed within the localized surface plasmon enhanced electric field, an increase in photoluminescence provided by the lumiphoric material may be realized, thereby increasing light output and/or efficiency of the corresponding light-emitting device. In certain embodiments, the plasmonic material comprises nanoparticles with dimensions of no more than 100 nm. In certain embodiments, the nanoparticles may be provided within a coating of dielectric material or adjacent to a coating of dielectric material. In other embodiments, individual nanoparticles may include outer shells that are coated with dielectric materials. In such embodiments, the nanoparticles with dielectric material outer shells may be mixed within the lumiphoric material or even chemically bonded with the lumiphoric material.

FIGS. 1A and 1B illustrate variations of an exemplary plasmonic material 10 that includes a nanoparticle 12 and a corresponding dielectric material 14 according to principles of the present disclosure. As described above, localized surface plasmon resonance may be excited at various interfaces between the nanoparticle 12 and the corresponding dielectric material 14 to form an associated localized surface plasmon enhanced electric field. In certain aspects, the nanoparticle 12 may comprise at least one of a metal nanoparticle such as aluminum (Al), silver (Ag), gold (Au), platinum (Pt), copper (Cu), nickel (Ni), chromium (Cr) and/or alloys thereof; and/or a metal nitride nanoparticle such as titanium nitride (TiN), zirconium nitride (ZrN), and/or hafnium nitride (HfN), among others. In certain embodiments, the dielectric material 14 may comprise an aluminum oxide (e.g., AlO, $Al_xO_y$, $Al_2O_3$), a silicon oxide (e.g., $SiO_2$), silicon nitride (e.g., SiN), and titanium oxide ($TiO_2$), among others. In certain embodiments, the nanoparticle 12 may comprise a single metal, while in other embodiments, the nanoparticle 12 may comprise a bi-metallic or a tri-metallic structure. In still further embodiments, the nanoparticle 12 may embody a Janus particle where at least one surface of the nanoparticle 12 comprises a first metal, such as Ag or any of the other metals listed above, and an opposing surface of the nanoparticle 12 is free of the first metal. The opposing surface may be free of any metal or the opposing surface may comprise a second metal that is different than the first metal. In this manner, the first metal side of the nanoparticle 12 may be arranged to receive incident light and excite a corresponding localized surface plasmon enhanced electric field while the opposing surface of the nanoparticle 12 may provide additional characteristics, such as altering or tuning a frequency of the localized surface plasmon enhanced electric field.

For illustrative purposes, the plasmonic material 10 in FIGS. 1A and 1B is illustrated as a single nanoparticle 12. In practice, the plasmonic material 10 may include a plurality of nanoparticles 12 with corresponding dielectric material 14. The nanoparticles 12 may form any number of shapes and combinations thereof, including spheres, pyramids, nanorods, and irregular or asymmetric three-dimensional shapes. In certain embodiments, the dielectric material 14 may be provided as a coating or a shell coating that is provided on each individual nanoparticle 12 as illustrated in FIG. 1A. In this manner, the plasmonic material 10 in FIG. 1A may be prefabricated for use in various LED applications. In certain embodiments, the dielectric material 14 in the form of a coating or shell may at least partially encapsulate an individual nanoparticle 12 such that one or more interfaces between the nanoparticle and the dielectric material 14 are formed. In further embodiments, the dielectric material 14 in the form of a coating or shell may entirely encapsulate an individual nanoparticle 12.

FIG. 1B illustrates an alternative configuration of the plasmonic material 10 where the nanoparticle 12 is provided on a surface 16 and the dielectric layer 14 is provided as a coating on the nanoparticle 12 and the surface 16. For example, the surface 16 may embody one or more surfaces that are associated with an LED chip or a structure that will be attached to an LED chip. In this manner, the nanoparticle 12 is first applied to the surface 16, followed by a blanket coating of the dielectric material 14.

FIG. 1C illustrates the plasmonic material 10 of FIG. 1A with an associated localized surface plasmon enhanced electric field 18 that is excited by incident light 20. In response to the incident light 20, free electrons $e^-$ oscillate at interfaces between the nanoparticle 12 and the dielectric material 14, thereby exciting localized surface plasmon resonance at the various interfaces. As a result, the localized surface plasmon enhanced electric field 18 may be induced in close proximity to the plasmonic material 10. While the arrangement of the plasmonic material 10 from FIG. 1A is illustrated in FIG. 1C, the principles are equally applicable to the arrangement of the plasmonic material 10 of FIG. 1B. FIG. 1D is a plot illustrating intensity of the localized surface plasmon enhanced electric field 18 relative to a distance away from the nanoparticle of FIG. 1C. As illustrated, the highest intensity of the localized surface plasmon enhanced electric field 18 is provided in areas that are closest to the nanoparticle 12 and the localized surface plasmon enhanced electric field 18 may exhibit an exponentially decaying intensity with increased distance away from the nanoparticle 12. In certain aspects related to LED devices where the incident light 20 is provided from an active region of a corresponding LED chip, the localized surface plasmon enhanced electric field 18 may extend a distance of about 30 nm or less, or about 20 nm or less, or about 10 nm or less, or in any range bounded by 0 nm to any of the above specified values.

Figure 2B:
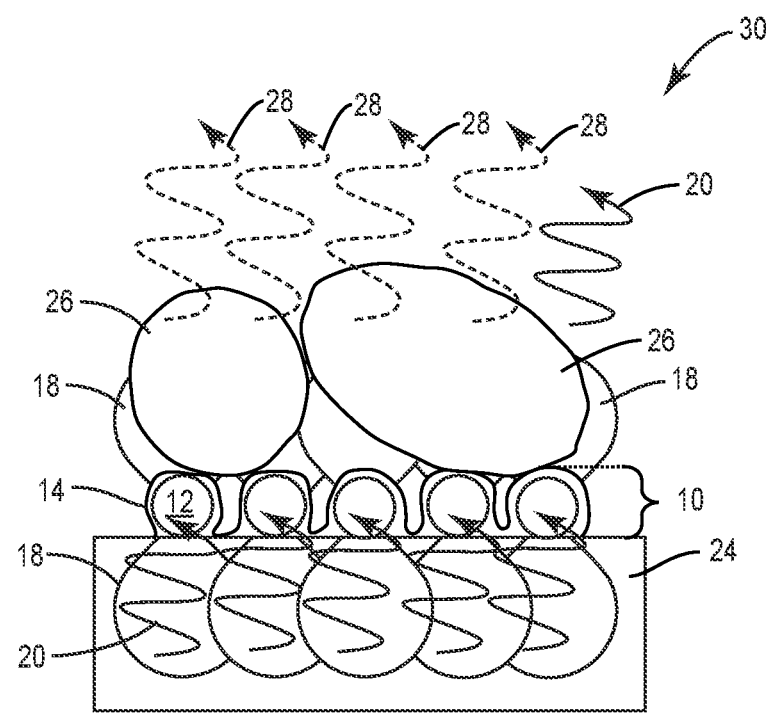
FIG. 2B is a cross-sectional view of a light-emitting device that is similar to the light-emitting device of FIG. 2A and further includes the plasmonic material as described for FIGS. 1A and 1B.

According to principles of the present disclosure, plasmonic materials may be arranged in close proximity to lumiphoric materials so that one or more portions of the lumiphoric materials may be arranged within the excited localized surface plasmon enhanced electric fields during operation. In this manner, the localized surface plasmon enhanced electric field may provide increased photoluminescence for the lumiphoric materials. FIGS. 2A and 2B respectively illustrate exemplary light-emitting devices and corresponding light interactions between an LED chip and a lumiphoric material alone (i.e., FIG. 2A) and in the presence of the plasmonic material 10 (i.e., FIG. 2B).

FIG. 2A is a cross-sectional view of a light-emitting device 22 that includes an LED chip 24 and a lumiphoric material 26 that is arranged to receive incident light 20 that is generated by the LED chip 24. In FIG. 2A, the lumiphoric material 26 is illustrated as a plurality of lumiphoric particles, such as phosphor particles. In practice, the lumiphoric material 26 may embody any of the previously described lumiphoric materials. As illustrated, some of the light 20 from the LED chip 24 is subject to wavelength conversion at the lumiphoric material 26 such that wavelength-converted light 28 is also provided. In this manner, the light-emitting device 22 is configured to provide aggregate emissions that include a mixture of both the light 20 from the LED chip 24 and the wavelength-converted light 28 from the lumiphoric material 26.

FIG. 2B is a cross-sectional view of a light-emitting device 30 that is similar to the light-emitting device 22 of FIG. 2A and further includes the plasmonic material 10 as described for FIGS. 1A and 1B. The plasmonic material 10 is illustrated as a plurality of nanoparticles 12 with corresponding dielectric material 14. As described for FIGS. 1A and 1B, the dielectric material 14 in FIG. 2B may be provided as a separate shell coating for each nanoparticle 12 or as a continuous coating that at least partially encapsulates multiple nanoparticles 12. The plasmonic material 10 is arranged to receive incident light 20 generated by the LED chip 24 and excite the localized surface plasmon enhanced electric field 18. In particular, each of the nanoparticles 12 and corresponding interfaces with the dielectric material 14 may generate localized portions of the overall combined localized surface plasmon enhanced electric field 18. By arranging the lumiphoric material 26 at least partially within the localized surface plasmon enhanced electric field 18, the lumiphoric material 26 may exhibit increased photoluminescence. In this regard, aggregate emissions from the light-emitting device 30 may include an increased amount of the wavelength-converted light 28. As described above, the localized surface plasmon enhanced electric field 18 may extend a distance of about 30 nm or less, or about 20 nm or less, or about 10 nm or less from the nanoparticles 12, or in any range bounded by 0 nm to any of the above specified values. Accordingly, at least a portion of the lumiphoric material 26 may be arranged within a same distance from the plasmonic material 10 and/or one or more of the nanoparticles 12. As further illustrated in FIG. 2B, a portion of the localized surface plasmon enhanced electric field 18 may also extend partially into portions of the LED chip 24 when the plasmonic material 10 is arranged in close proximity to the LED chip 24. The nanoparticles 12 may be formed on the LED chip 24 by one or more of electrostatic printing, laser printing, and deposition.

Figure 3:
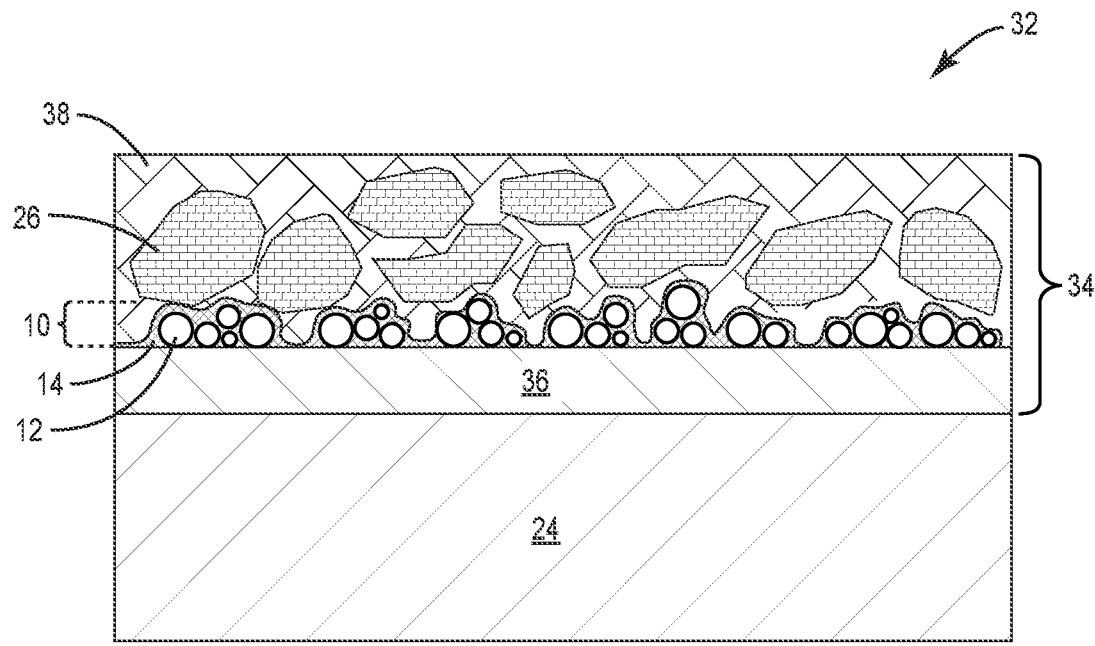
FIG. 3 is a cross-sectional view of a light-emitting device where the plasmonic material is incorporated within a wavelength conversion element that is arranged on an LED chip.

FIG. 3 is a cross-sectional view of a light-emitting device 32 where the plasmonic material 10 is incorporated within a wavelength conversion element 34 that is arranged on the LED chip 24. In certain aspects, the wavelength conversion element 34 embodies a preformed structure that may be attached or otherwise mounted on the LED chip 24. The wavelength conversion element 34 may initially be formed of a larger sheet that is subsequently cut or otherwise singulated to provide individual ones of the wavelength conversion element 34 that are appropriately sized for the particular LED chip 24. In certain embodiments, the wavelength conversion element 34 may comprise a support element 36 that supports the plurality of nanoparticles 12. The support element 36 may comprise a light transparent and/or light transmissive material, such as one or more of glass and sapphire, so that light from the LED chip 24 may freely pass through the support element 36.

To form the wavelength conversion element 34, the nanoparticles 12 may first be formed, attached or even grown directly on the support element 36. In certain embodiments, the nanoparticles 12 may be formed on the support element 36 by one or more of electrostatic printing, laser printing, and deposition. This may be followed by an application of the dielectric material 14 in the form of a film that at least partially covers or even entirely covers the nanoparticles 12. In certain embodiments, the film of the dielectric layer 14 may comprise a thickness in a range from 1 nm to about 10 nm. In this regard, the dielectric material 14 may be thinner than a particle size of an individual nanoparticle 12 or an average particle size of the nanoparticles 12 while still providing the plasmonic material 10 with various interfaces between the dielectric material 14 and the nanoparticles 12. Next, the lumiphoric material 26 may be formed on the plasmonic material 10. In certain embodiments, the lumiphoric material 26 may be provided in the form of particles that are suspended in a binder 38, such as silicone, epoxy, and/or glass. The wavelength conversion element 34 may therefore comprise the support element 36, the nanoparticles 12, the dielectric material 14, the particles of lumiphoric material 26, and the corresponding binder 38. As illustrated in FIG. 3, the wavelength conversion element 34 may be attached to the LED chip such that the support element 36 is arranged between the plasmonic material 10 and the LED chip 24.

Figure 4:
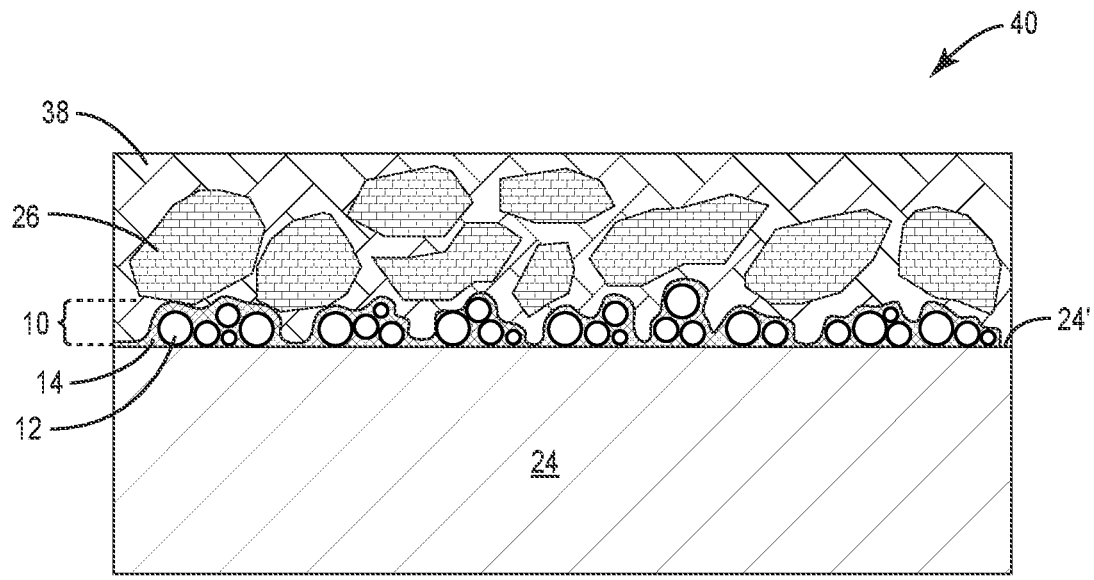
FIG. 4 is a cross-sectional view of a light-emitting device that is similar to the light-emitting device of FIG. 3, but where the plasmonic material is provided on a surface of the LED chip and without the intervening support element of FIG. 3.

FIG. 4 is a cross-sectional view of a light-emitting device 40 that is similar to the light-emitting device 32 of FIG. 3, but where the plasmonic material 10 is provided on a surface 24' of the LED chip 24 and without the intervening support element 36 of FIG. 3. In FIG. 4, the nanoparticles 12 may be formed on the surface 24' of the LED chip 24, followed by application of the dielectric material 14 in a similar manner as described for FIG. 3, followed by application of the lumiphoric material 26 and corresponding binder 38. In certain embodiments, the surface 24' of the LED chip 24 may embody a growth substrate of the LED chip 24, such as sapphire or silicon carbide, when the LED chip 24 is provided in a flip-chip arrangement. In other embodiments, the growth substrate may be removed from the LED chip 24 and the surface 24' embodies an epitaxial layer of the LED chip 24, such as an n-type GaN layer for GaN-based material systems. In other embodiments where the LED chip 24 is not provided in a flip-chip arrangement, the surface 24' of the LED chip 24 may embody a surface of the LED chip 24 opposite the growth substrate.

Figure 5:
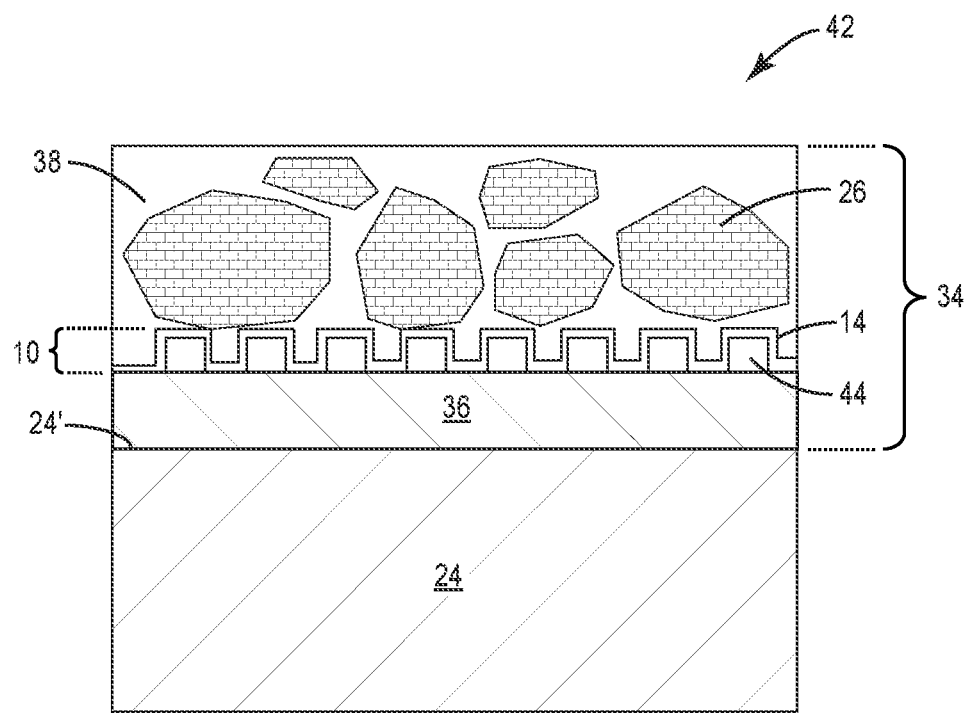
FIG. 5 is a cross-sectional view of a light-emitting device that is similar to the light-emitting device of FIG. 3, but where the plasmonic material comprises a patterned structure with the corresponding dielectric material.

FIG. 5 is a cross-sectional view of a light-emitting device 42 that is similar to the light-emitting device 32 of FIG. 3, but where the plasmonic material 10 comprises a patterned structure 44 with the corresponding dielectric material 14. In place of or in addition to the nanoparticles 12 of previous embodiments, the plasmonic material 10 may include the patterned structure 44. The patterned structure 44 may comprise any of the materials previously described for the nanoparticles that provide one or more interfaces with the dielectric material 14 for exciting localized surface plasmon resonance. For example, the patterned structure 44 may comprise one or more of Al, Ag, Au, and/or alloys thereof, as well as various metal nitrides such as TiN, ZrN, and/or HfN, among others. In such examples, the patterned structure 44 may be referred to as a patterned metal structure. The patterned structure 44 may be formed by blanket deposition followed by selective removal of certain portions to provide a pattern as illustrated in FIG. 5. Alternatively, the patterned structure 44 may be formed by selective deposition, such as through a patterned mask. The patterned structure 44 may comprise an array of separated features such that portions of the dielectric material 14 may be arranged between adjacent features of the patterned structure 44, thereby providing many interfaces therebetween. The array of separated features may comprise individual islands of the patterned structure 44 that are formed across the light-emitting device 42. In alternative arrangements, the array of separated features may form elongated rows that are spaced apart from one another or a grid array of interconnected rows and columns. In certain embodiments, the patterned structure 44 and corresponding dielectric material 14 may be formed on the support element 36 along with the lumiphoric material 26 and corresponding binder 38 to form the wavelength conversion element 34. The nature of the patterned structure 44 allows various shapes and concentrations of the patterned structure 44 and corresponding dielectric material 14 to be tailored differently in different areas of the LED chip 24. In this manner, the corresponding localized surface plasmon enhanced electric field may be non-uniformly distributed in different areas of the LED chip 24.

Figure 6:
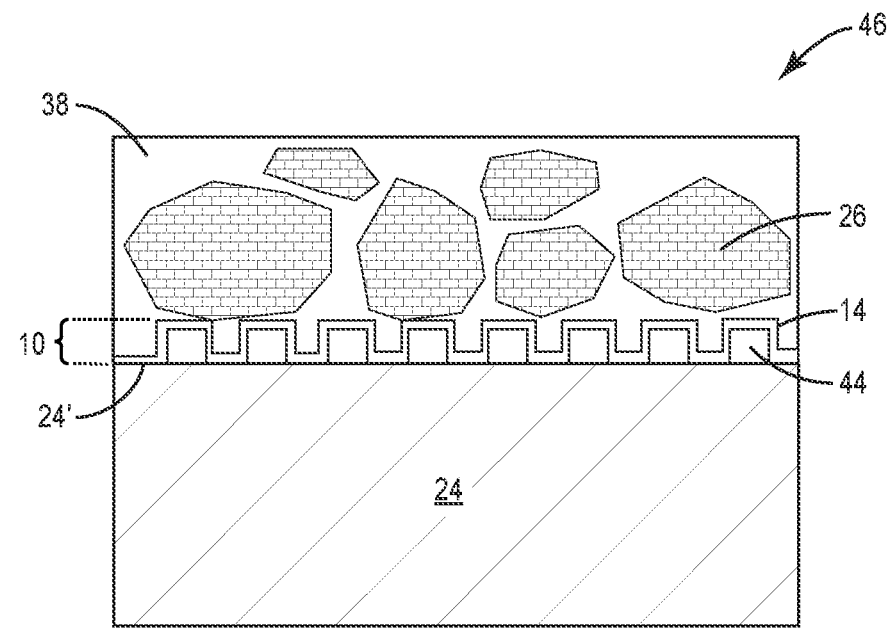
FIG. 6 is a cross-sectional view of a light-emitting device that is similar to the light-emitting device of FIG. 5, but where the plasmonic material includes the patterned structure that is provided on the surface of the LED chip and without the intervening support element of FIG. 5.

FIG. 6 is a cross-sectional view of a light-emitting device 46 that is similar to the light-emitting device 42 of FIG. 5, but where the plasmonic material 10 includes the patterned structure 44 that is provided on the surface 24' of the LED chip 24 without the intervening support element 36 of FIG. 5. In this regard, the patterned structure 44 may be formed directly on the LED chip 24, followed by application of the dielectric material 14 and the lumiphoric material 26 with the binder 38 in successive fashion. As described above, the patterned structure 44 may be tailored differently across different areas of the LED chip 24.

Figure 7:
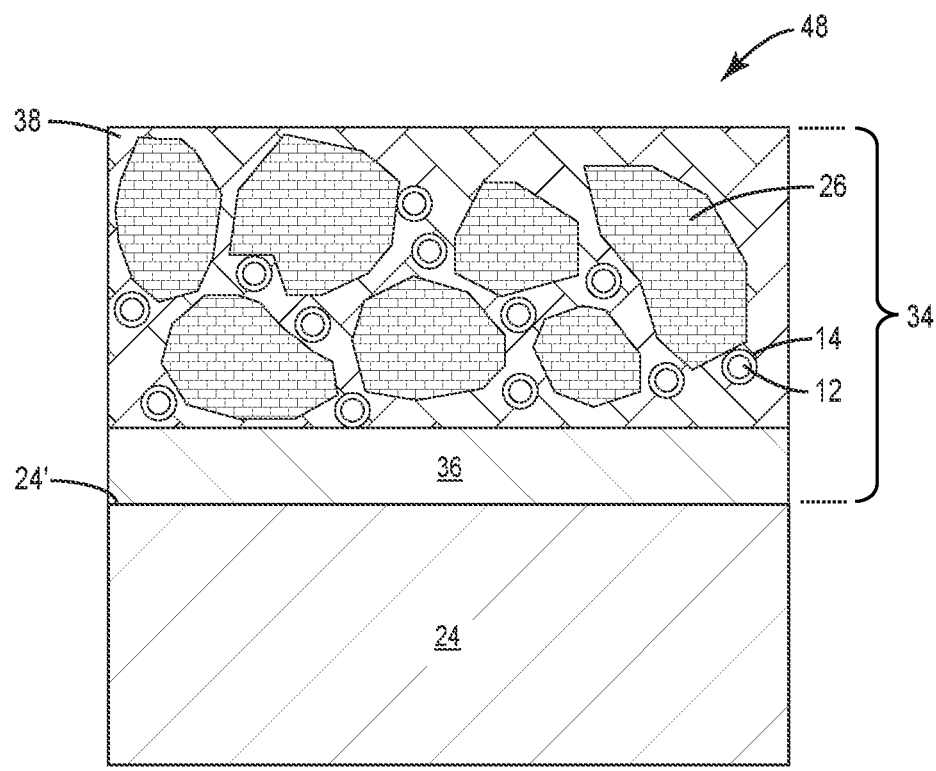
FIG. 7 is a cross-sectional view of a light-emitting device that is similar to the light-emitting device of FIG. 3, but where the plasmonic material is intermixed with the lumiphoric material within the binder.

FIG. 7 is a cross-sectional view of a light-emitting device 48 that is similar to the light-emitting device 32 of FIG. 3, but where the plasmonic material is intermixed with the lumiphoric material 26 within the binder 38. In this regard, the plasmonic material may embody a plurality of nanoparticles 12 with the corresponding dielectric material 14 in the form of a coating and/or shell that is provided on each individual nanoparticle 12 as described above for FIG. 1A. By providing the plasmonic material in the form of dielectric coated nanoparticles 12, the plasmonic material may be readily mixed with the lumiphoric material 26 within the binder 38 and integrated within the wavelength conversion element 34 in a same fabrication step. Additionally, such an arrangement allows the plasmonic material to be present throughout the lumiphoric material 26 in order to provide localized surface plasmon resonance throughout the lumiphoric material 26.

Figure 8:
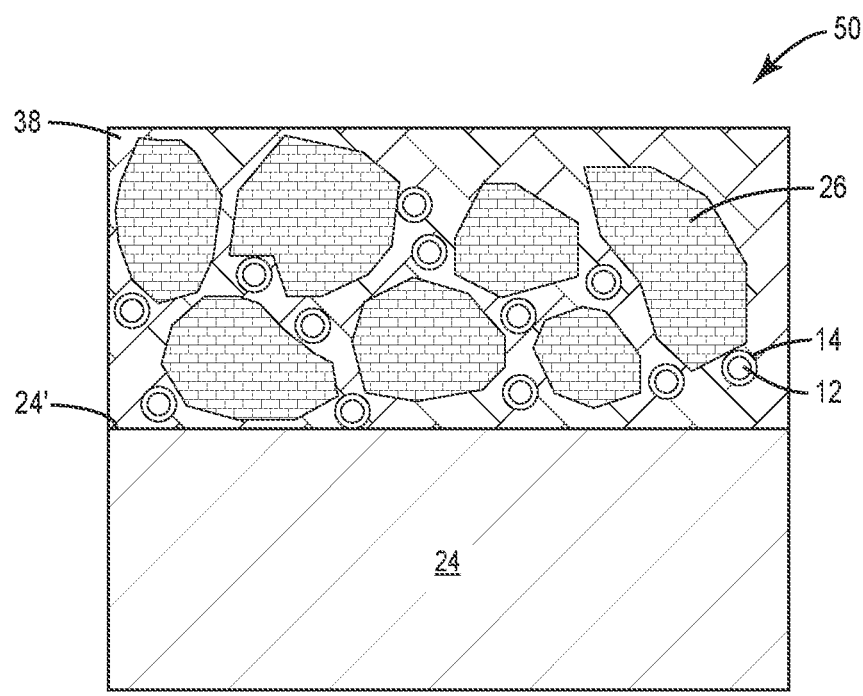
FIG. 8 is a cross-sectional view of a light-emitting device that is similar to the light-emitting device of FIG. 7, but where the plasmonic material is intermixed with the lumiphoric material and applied on the LED chip without the intervening support element of FIG. 7.

FIG. 8 is a cross-sectional view of a light-emitting device 50 that is similar to the light-emitting device 48 of FIG. 7, but where the plasmonic material is intermixed with the lumiphoric material 26 and applied on the surface 24' of the LED chip 24 without the intervening support element 36 of FIG. 7. The intermixing of the plasmonic material (i.e., the nanoparticles 12 with the corresponding coatings or shells of the dielectric material 14) with the lumiphoric material 26 allows application directly to the LED chip 24 by any number of techniques, including dispensing and/or spray coating.

Figure 9:
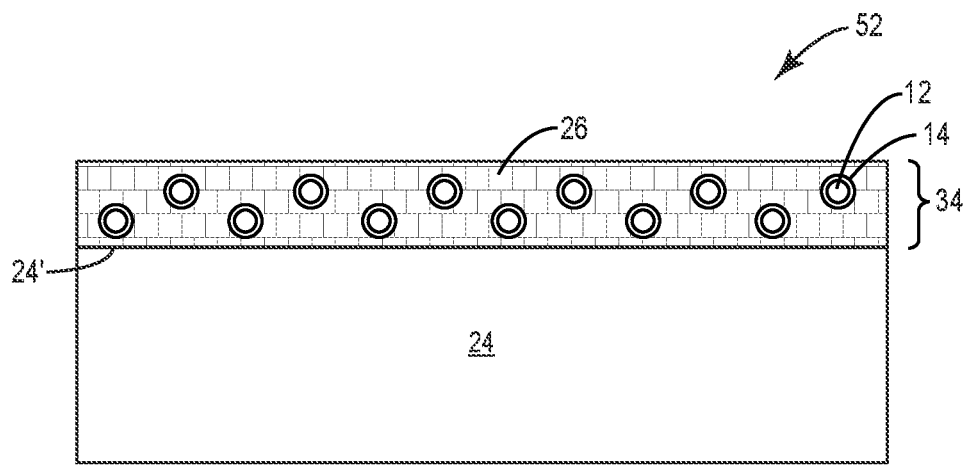
FIG. 9 is a cross-sectional view of a light-emitting device that is similar to the light-emitting device of FIG. 7, but where the wavelength conversion element embodies a ceramic phosphor plate and the plasmonic material is intermixed within the ceramic phosphor plate.

FIG. 9 is a cross-sectional view of a light-emitting device 52 that is similar to the light-emitting device 48 of FIG. 7, but where the wavelength conversion element 34 embodies a ceramic phosphor plate and the plasmonic material is intermixed within the ceramic phosphor plate. Ceramic phosphor plates may be formed by mixing the lumiphoric material 26, in this case phosphor particles, with ceramic materials. The mixture may then be pressed into a planar shape, and followed by firing or sintering to harden the mixture and form the wavelength conversion element 34. As illustrated in FIG. 9, the plasmonic material (i.e., the nanoparticles 12 with the corresponding coatings or shells of the dielectric material 14) may be incorporated throughout the ceramic phosphor plate. This may be accomplished by mixing the plasmonic material with the lumiphoric material 26 and the ceramic materials before firing. Such an arrangement allows formation of larger sheets that may be singulated into individual ones of the wavelength conversion elements 34 that are prepopulated with the plasmonic material.

Figure 10:
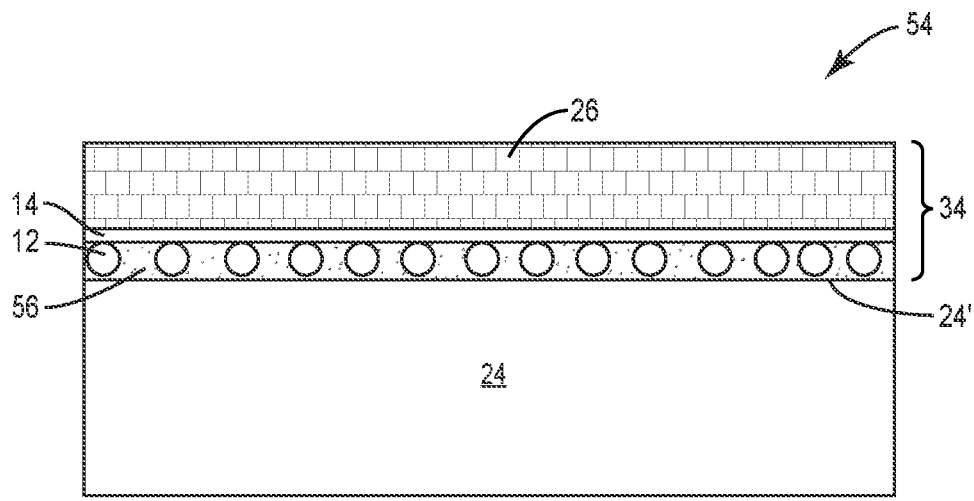
FIG. 10 is a cross-sectional view of a light-emitting device that is similar to the light-emitting device of FIG. 9, but where the plasmonic material is formed separately from the lumiphoric material.

FIG. 10 is a cross-sectional view of a light-emitting device 54 that is similar to the light-emitting device 52 of FIG. 9, but where the plasmonic material is formed separately from the lumiphoric material 26. As illustrated, the wavelength conversion element 34 may include the lumiphoric material 26 in the form of a ceramic phosphor plate as described above for FIG. 9, or the lumiphoric material 26 may be provided in the form of a single crystal phosphor. The dielectric material 14 may then be provided as a film or coating on the lumiphoric material 26, followed by providing the nanoparticles 12 on the dielectric material 14 to form the wavelength conversion element 34. In certain embodiments, the dielectric material 14 may be provided with a thickness that is thinner than a particle size of the nanoparticles 12. A transparent adhesive material 56, such as silicone, may be provided to at least partially cover the nanoparticles 12 and for bonding the wavelength conversion element 34 to the LED chip 24.

While many of the previously described embodiments are illustrated with generally even distributions of plasmonic material, the principles of the present disclosure are also applicable to non-uniform distributions of the plasmonic material in order to excite localized surface plasmon resonance differently in different portions of the light-emitting devices. In this manner, the localized surface plasmon enhanced electric field may be generated in specific portions of a light-emitting device where increased photoluminescence may be desired. Additionally, the plasmonic material may be provided in different concentrations across the light-emitting device for similar purposes. For example, perimeter edges of an LED chip may sometimes exhibit non-uniform brightness and/or color mixing due to nonuniform wavelength conversion. By placing the plasmonic material or an increased amount of the plasmonic material near the perimeter edges, the corresponding increased photoluminescence may increase overall brightness and color mixing uniformity.

Figure 11:
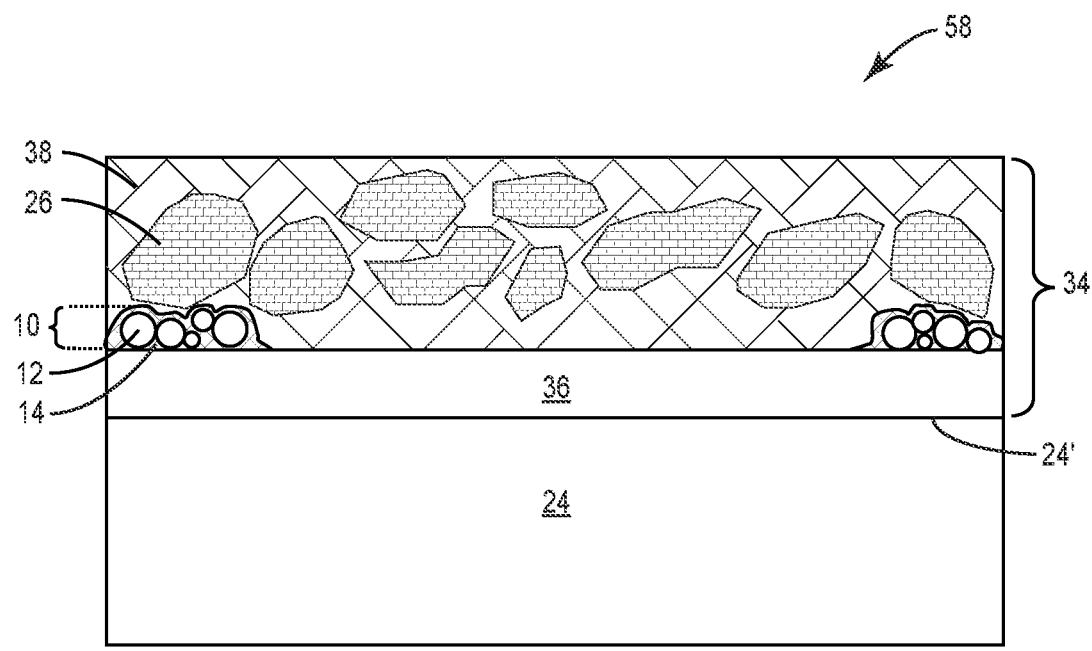
FIG. 11 is a cross-sectional view of a light-emitting device that is similar to the light-emitting device of FIG. 3, but where the plasmonic material is only provided near peripheral edges of the LED chip.

FIG. 11 is a cross-sectional view of a light-emitting device 58 that is similar to the light-emitting device 32 of FIG. 3, but where the plasmonic material 10 is only provided near peripheral edges of the LED chip 24. This may be performed by providing the nanoparticles 12 and dielectric material 14 through a mask. In certain embodiments, the plasmonic material 10 may be provided on the support element 36 of the wavelength conversion element 34. In other embodiments, the support element 36 may be omitted and the plasmonic material 10 may be formed through a mask that covers central portions of the LED chip 24. As described above, in certain instances the amount of light subject to wavelength conversion may be nonuniform. For example, portions of the lumiphoric material 26 that are registered with central portions of the LED chip 24 may receive more light and accordingly provide increased amounts of wavelength converted light as compared to the peripheral edges of the LED chip 24. By providing the plasmonic material 10 only in areas that are registered at or near peripheral edges of the LED chip 24, such nonuniformities may be accounted for by increased photoluminescence attributed to the localized surface plasmon enhanced electric field.

Figure 12:
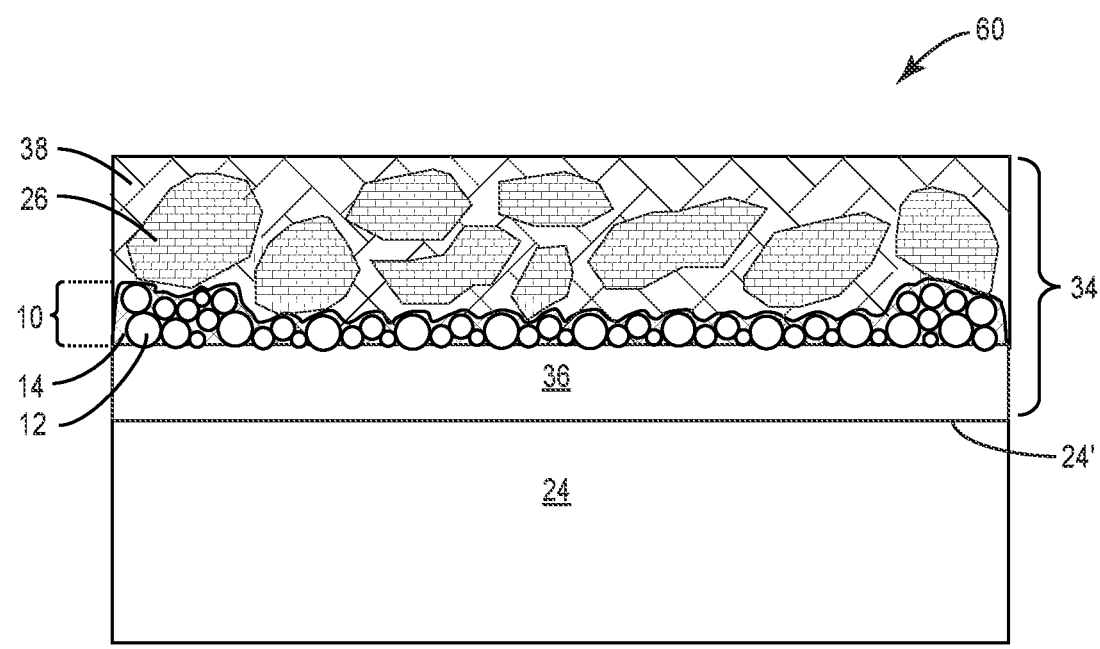
FIG. 12 is a cross-sectional view of a light-emitting device that is similar to the light-emitting device of FIG. 11, but where the plasmonic material is provided in non-uniform distributions across the light-emitting device.

FIG. 12 is a cross-sectional view of a light-emitting device 60 that is similar to the light-emitting device 58 of FIG. 11, but where the plasmonic material 10 is provided in non-uniform distributions across the light-emitting device 60. As used herein, non-uniform distributions may refer to differences in at least one of a density, size and shape of the plasmonic material 10 across areas of the light-emitting device 60. As described for FIG. 11, the non-uniform distribution may be tailored to compensate for possible non-uniformities in wavelength conversion near peripheral edges of the LED chip 24. Rather than having central portions of the light-emitting device 60 devoid of the plasmonic material 10 like in FIG. 11, the plasmonic material 10 in FIG. 12 is provided in reduced quantities along areas registered with the central portions. As such, the plasmonic material 10 is thicker in regions that are registered at or near the peripheral edges of the LED chip 24 and thinner along the central regions. In this regard, non-uniformities in wavelength conversion may be compensated for while still providing increased overall increased photoluminescence across all or most portions of the light-emitting device 60. As with previous embodiments, the principles disclosed for FIG. 12 are applicable to embodiments with and without the support element 36.

Figure 13:
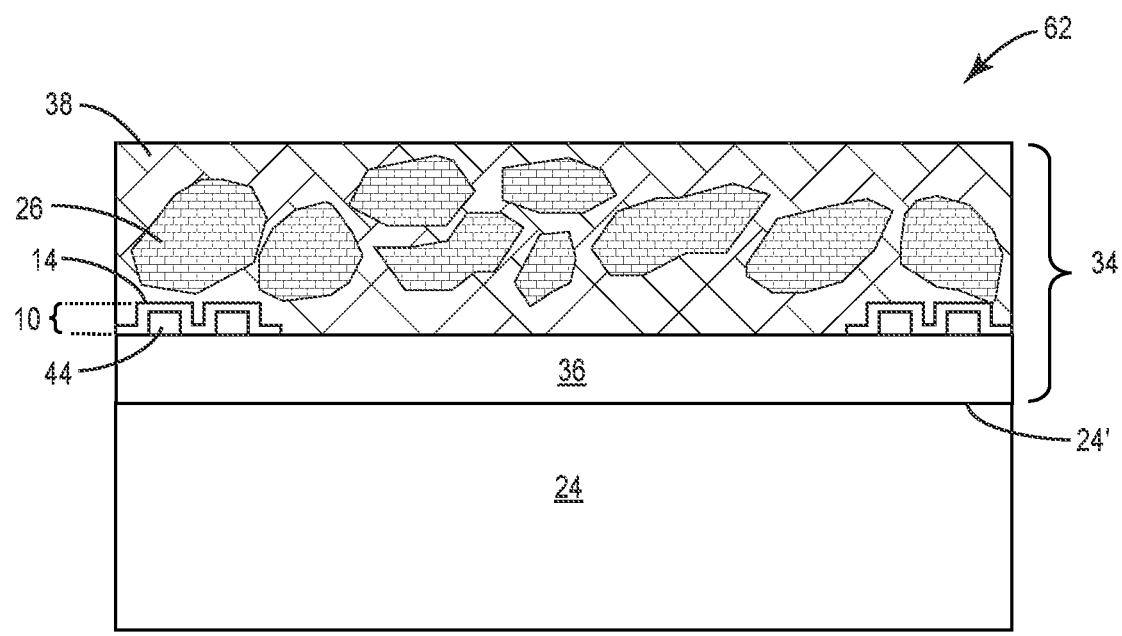
FIG. 13 is a cross-sectional view of a light-emitting device that is similar to the light-emitting device of FIG. 11, but where the plasmonic material comprises the patterned structure and corresponding dielectric material in a similar manner as described for FIGS. 5 and 6.

FIG. 13 is a cross-sectional view of a light-emitting device 62 that is similar to the light-emitting device 58 of FIG. 11, but where the plasmonic material 10 comprises the patterned structure 44 and corresponding dielectric material 14 in a similar manner as described for FIGS. 5 and 6. In this regard, the light-emitting device 60 of FIG. 12 may include the patterned structure 44 and dielectric material 14 arranged along or near peripheral edges of the LED chip 24. The patterning may be performed by selective removal or selective deposition as described above on either the support element 36 or on the surface 24' of the LED chip 24 if the support element 36 is omitted. The flexibility of the patterning process allows numerous variations of non-uniform distributions of the patterned structure 44 and corresponding dielectric material 14. For example, central portions of the light-emitting device 62 may have reduced distributions of the plasmonic material 10 compared to the peripheral edges. Additionally, while rectangular shapes are illustrated for the patterned structure 44, more complex shapes may be provided to shape and/or enhance the associated localized surface plasmon enhanced electric fields differently in different areas of the light-emitting device 62.

In still further embodiments of the present disclosure, plasmonic materials may be directly bonded to lumiphoric materials at the particle level, thereby providing lumiphoric particles that include an integrated plasmonic material. In this regard, the lumiphoric particles with integral plasmonic material may be handled and arranged in various light-emitting devices in a similar manner as conventional lumiphoric particles. For example, lumiphoric particles with integral plasmonic material may be suspended in a binder and dispensed or spray-coated on surfaces of an LED chip and/or LED package. Lumiphoric particles with integral plasmonic material may be provided on transparent support elements of wavelength conversion elements of LED chips and/or LED packages. In certain embodiments, lumiphoric particles with integral plasmonic material may be formed by chemically bonding plasmonic material to lumiphoric particles.

Figure 14:
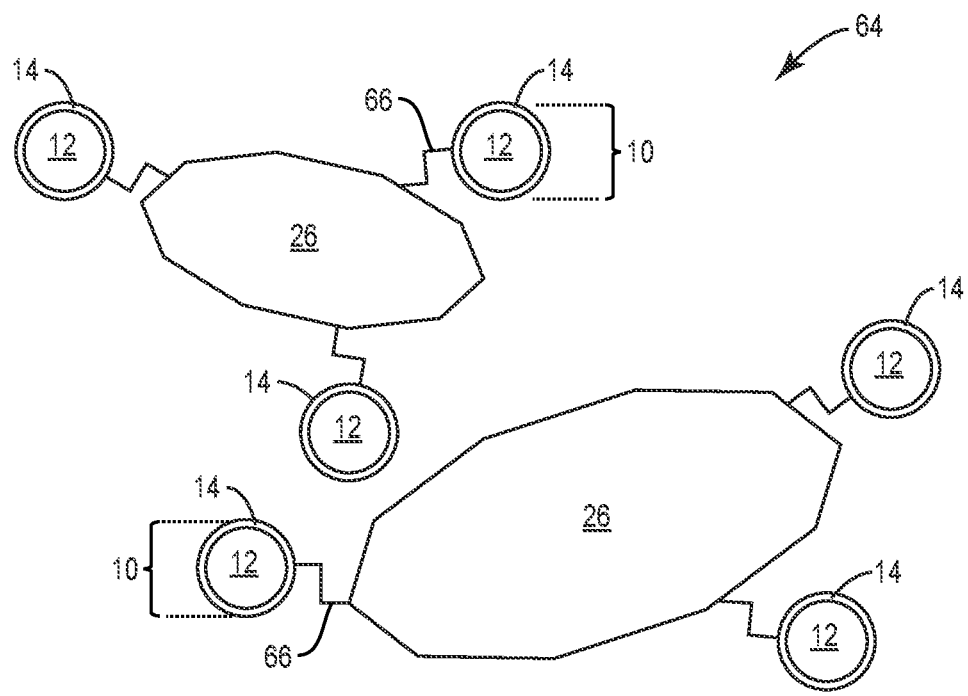
FIG. 14 is a cross-sectional view of a structure where the lumiphoric material is bonded to the plasmonic material at the particle level.

FIG. 14 is a cross-sectional view of a structure 64 where the lumiphoric material 26 is bonded to the plasmonic material 10 at the particle level. In this regard, the lumiphoric material 26 in FIG. 14 is illustrated as one or more lumiphoric particles, such as phosphor particles. The plasmonic material 10 includes at least one or even a plurality of nanoparticles 12, each of which is coated with the dielectric material 14 in a manner similar to FIG. 1A. The plasmonic material 10 may be chemically bonded to the lumiphoric material 26 by way of one or more chemical linker chains 66. The chemical linker chains 66 may represent any chemical bond, such as chemical linking by way of free amine groups of the lumiphoric material 26 and/or the plasmonic material 10. For illustrative purposes, only two particles of the lumiphoric material 26 with bonded plasmonic material 10 are illustrated, although in practice, a plurality of lumiphoric particles with pre-bonded plasmonic material 10 may be provided. By preforming lumiphoric particles with the plasmonic material 10, the lumiphoric material 26 itself may be provided with integral capabilities for providing increased photoluminescence by way of integrated localized surface plasmon enhanced electric fields.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:
1. A light-emitting device comprising:
 a light-emitting diode (LED) chip;
 a plasmonic material on the LED chip, wherein the plasmonic material is arranged to receive light emitted by the LED chip and induce a localized surface plasmon enhanced electric field; and
 a lumiphoric material arranged to receive light emitted by the LED chip, wherein the lumiphoric material is arranged at least partially within the localized surface plasmon enhanced electric field;
 wherein the plasmonic material is arranged with decreased concentrations in areas that are registered with central portions of the LED chip as compared with other areas that are registered at or near peripheral portions of the LED chip.

2. The light-emitting device of claim 1, wherein at least a portion of the lumiphoric material is arranged within 30 nanometers (nm) of the plasmonic material.

3. The light-emitting device of claim 1, wherein at least a portion of the lumiphoric material is arranged within 10 nanometers (nm) of the plasmonic material.

4. The light-emitting device of claim 1, wherein the plasmonic material comprises at least one interface between a metal and a dielectric material.

5. The light-emitting device of claim 4, wherein the metal comprises a patterned structure.

6. The light-emitting device of claim 1, wherein the plasmonic material comprises a plurality of metal nanoparticles.

7. The light-emitting device of claim 6, wherein an individual metal nanoparticle of the plurality of metal nanoparticles comprises a shell coating of a dielectric material that at least partially encapsulates the individual metal nanoparticle.

8. The light-emitting device of claim 6, wherein a dielectric material forms a continuous coating that at least partially encapsulates the plurality of metal nanoparticles.

9. The light-emitting device of claim 8, wherein a thickness of the dielectric material is less than an average particle size of the plurality of metal nanoparticles.

10. The light-emitting device of claim 1, wherein the plasmonic material is chemically bonded to the lumiphoric material.

11. The light-emitting device of claim 1, wherein:
the plasmonic material comprises a plurality of nanoparticles that are coated with a dielectric material;
the lumiphoric material comprises a plurality of lumiphoric particles; and
each lumiphoric particle of the plurality of lumiphoric particles is chemically bonded to at least one nanoparticle of the plurality of nanoparticles.

12. The light-emitting device of claim 1, wherein:
the plasmonic material comprises a plurality of nanoparticles that are coated with a dielectric material; and
the lumiphoric material comprises a plurality of lumiphoric particles in a binder, and the plasmonic material is intermixed with the plurality of lumiphoric particles within the binder.

13. The light-emitting device of claim 1, wherein:
the plasmonic material comprises a plurality of nanoparticles that are coated with a dielectric material; and
the lumiphoric material comprises a ceramic phosphor plate, and the plasmonic material is arranged within the ceramic phosphor plate.

14. The light-emitting device of claim 1, wherein:
the lumiphoric material comprises a single crystal phosphor; and
the plasmonic material is separated from the single crystal phosphor by a layer of dielectric material.

15. The light-emitting device of claim 1, wherein the areas that are registered with central portions of the LED chip are devoid of the plasmonic material.

16. A light-emitting device comprising:
a light-emitting diode (LED) chip; and
a wavelength conversion element that is arranged on the LED chip, wherein the wavelength conversion element comprises:
a support element;
a plasmonic material on the support element, wherein the plasmonic material is arranged to receive light emitted by the LED chip and induce a localized surface plasmon enhanced electric field, and the plasmonic material is arranged with a decreased concentration in an area that is registered with a central portion of the LED chip as compared with other areas that are registered at or near peripheral portions of the LED chip; and
a lumiphoric material arranged to receive light emitted by the LED chip, wherein the lumiphoric material is arranged at least partially within the localized surface plasmon enhanced electric field.

17. The light-emitting device of claim 16, wherein at least a portion of the lumiphoric material is arranged within 30 nanometers (nm) of the plasmonic material.

18. The light-emitting device of claim 16, wherein the plasmonic material comprises a plurality of metal nanoparticles on the support element and the plurality of metal nanoparticles are coated with a dielectric material.

19. The light-emitting device of claim 16, wherein the plasmonic material comprises a patterned metal on the support element, and the patterned metal is coated with a dielectric material.

20. The light-emitting device of claim 16, wherein the lumiphoric material comprises a plurality of lumiphoric particles in a binder, and the plasmonic material is intermixed with the plurality of lumiphoric particles within the binder.

21. The light-emitting device of claim 20, wherein the plasmonic material comprises a plurality of nanoparticles that are coated with a dielectric material.

22. The light-emitting device of claim 20, wherein the plasmonic material comprises a plurality of metal nanoparticles, and each lumiphoric particle of the plurality of lumiphoric particles is chemically bonded to at least one metal nanoparticle of the plurality of nanoparticles.

23. A light-emitting device comprising:
a light-emitting diode (LED) chip;
a plasmonic material comprising a plurality of nanoparticles that are coated with a dielectric material, the plasmonic material being arranged to receive light emitted by the LED chip and induce a localized surface plasmon enhanced electric field; and
a lumiphoric material comprising a ceramic phosphor plate arranged to receive light emitted by the LED chip, the plasmonic material being arranged within the ceramic phosphor plate so that the lumiphoric material is at least partially within the localized surface plasmon enhanced electric field.

24. A light-emitting device comprising:
a light-emitting diode (LED) chip;
a plasmonic material arranged to receive light emitted by the LED chip and induce a localized surface plasmon enhanced electric field;
a lumiphoric material comprising a single crystal phosphor arranged to receive light emitted by the LED chip, the lumiphoric material being arranged at least partially within the localized surface plasmon enhanced electric field; and
a layer of dielectric material arranged to separate the plasmonic material from the single crystal phosphor.

* * * * *